United States Patent
Wang et al.

(10) Patent No.: US 6,949,268 B2
(45) Date of Patent: Sep. 27, 2005

(54) FREQUENCY UNIFORMITY OF FILM BULK ACOUSTIC RESONATORS

(75) Inventors: Li-Peng Wang, Santa Clara, CA (US); Dong S. Shim, San Jose, CA (US); Qing Ma, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 20 days.

(21) Appl. No.: 10/185,399

(22) Filed: Jun. 28, 2002

(65) Prior Publication Data

US 2004/0001913 A1 Jan. 1, 2004

(51) Int. Cl.⁷ .................................................. B05D 5/12
(52) U.S. Cl. ..................... 427/58; 427/240; 427/282; 427/402; 427/421.1
(58) Field of Search .................. 427/240, 58, 282, 427/402, 421, 421.1

(56) References Cited

U.S. PATENT DOCUMENTS

| 6,051,907 A | * | 4/2000 | Ylilammi | ..................... 310/312 |
| 6,419,803 B1 | * | 7/2002 | Baldwin et al. | ....... 204/192.13 |
| 6,456,173 B1 | * | 9/2002 | Ella et al. | ..................... 333/188 |

* cited by examiner

Primary Examiner—Brian K. Talbot
(74) Attorney, Agent, or Firm—Trop, Pruner & Hu, P.C.

(57) ABSTRACT

The frequency uniformity of a film bulk acoustic resonator may be improved by controlling the thickness across a wafer of one or more layers of the film bulk acoustic resonator. One or more layers of the film bulk acoustic resonator may be deposited in a way that irregularities in the deposition process from one die to another may be controlled.

9 Claims, 3 Drawing Sheets

FREQUENCY UNIFORMITY OF FILM BULK ACOUSTIC RESONATORS

BACKGROUND

This invention relates generally to film bulk acoustic resonators.

Front-end filters that include film bulk acoustic resonators (FBAR) are advantageous compared to other filter technologies such as surface acoustic wave (SAW) devices and ceramic filters, particularly, at relatively high frequencies. For example, SAW filters may begin to have excessive insertion losses above 2.4 gigahertz (GHz). Ceramic filters are much larger in size and become increasingly difficult to fabricate as frequency increases.

A conventional FBAR filter includes two sets of FBARs in order to achieve the desired filter response. The series FBARs have the same first frequency and shunt FBARs have the same second frequency. The frequency of each FBAR is primarily determined by the thickness of its piezoelectric film. The frequencies of the series and shunt FBARs need to be precisely controlled in order to have the desired filter response, such as the desired central frequency and pass bandwidth.

As an example, a 2 GHz FBAR may have a piezoelectric film thickness of approximately 1.8 micrometers. If a one percent thickness non-uniformity occurs, the frequency of the FBAR may shift 20 megahertz, which may not be acceptable if a 60 megahertz band pass is required.

To overcome the problem of frequency shifts arising from film thickness errors, post-process trimming may be used to correct the frequency. Post-process trimming techniques include using the mass loading effect and etching the top metal layer or depositing more metal. Alternatively, post-trimming techniques may involve the use of a heating element. All of these techniques are die-level processes and, as a result, have relatively low throughput. In addition, in-situ measurement is required during the post-process trimming steps. Therefore, the cost may be relatively high. As a result, die-level post-trimming techniques are not suitable for high volume manufacturing.

Thus, there is a need for a way to improve the frequency uniformity of film bulk acoustic resonators which is more suitable for high volume manufacturing.

DETAILED DESCRIPTION

Figure 1:
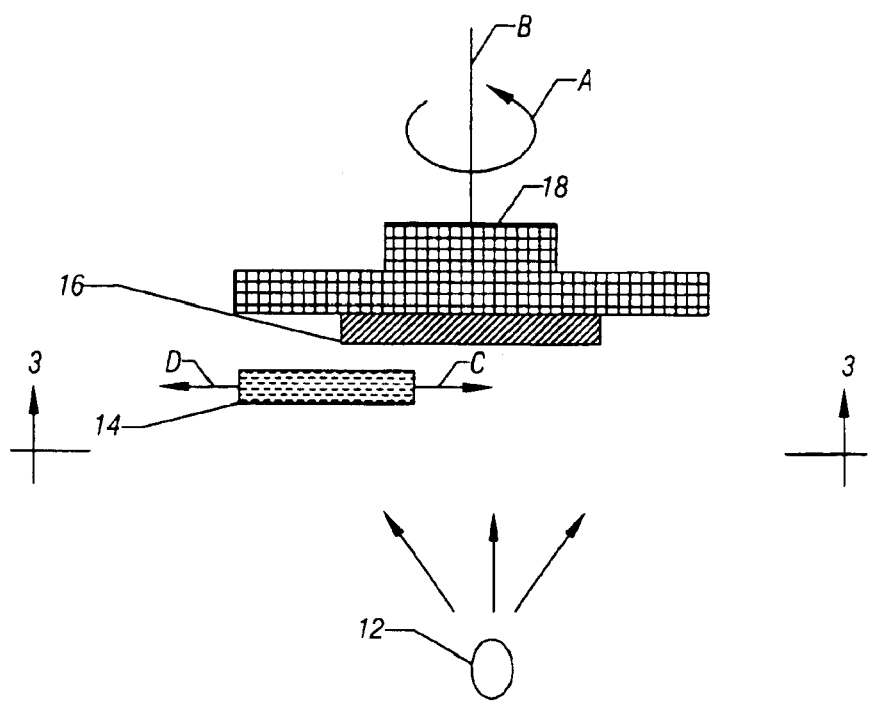
FIG. 1 is a side elevational view of one embodiment of the present invention.

Referring to FIG. 1, an apparatus for improving the uniformity of deposition of various layers of a film bulk acoustic resonator (FBAR) includes a film deposition source 12. The deposition source 12 may be used to deposit electrodes or piezoelectric film for making FBARs.

The deposition source 12 deposits a film on a semiconductor wafer 16. The wafer 16 may be rotated by a chuck 18. The chuck 18 may rotate around the axis B in the direction indicated by A in order to rotate the wafer 16. While the wafer 16 rotates, a shutter 14 may move linearly and radially across the sprayed deposition film in the directions of the arrows C and D in one embodiment. As a result, the amount of material that is deposited at any given location along the wafer 16 may be controlled by controlling the dwell time of the shutter 14 in the path of oncoming deposited film.

Figure 2:
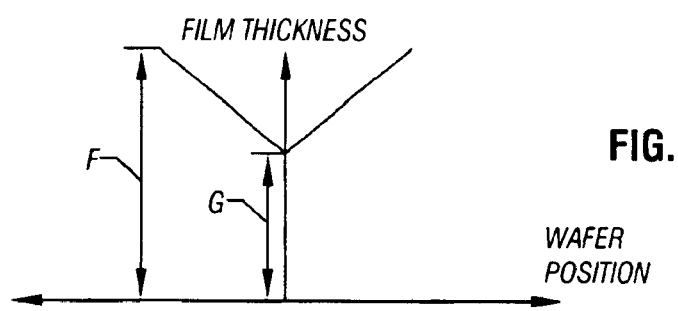
FIG. 2 shows an example of the film thickness control which may be achieved in some embodiments of the present invention.

For example, by increasing the dwell time at the center of the wafer 16 and decreasing the dwell at the edges of the wafer 16, the film thickness profile, shown in FIG. 2, may be achieved. Because the dwell time of the shutter 14 is greater at the center, the thickness of the deposited film, indicated at G in FIG. 2, may be less at the wafer's center. Conversely, because the dwell time near the edges of the wafer 16 is less, the film thickness F near the edges may be greater. Other desired film thickness profiles may be achieved.

However, by appropriately controlling the dwell time of the shutter 14, the uniformity of deposition on each die in a wafer 16 may be controlled. For example, if it is realized that too much material is being deposited on the dice near the center of the wafer 16, the dwell time of the shutter 14 near the center may be increased to counteract this effect. As a result, the uniformity of deposition across the wafer 16 and from die-to-die may be improved, increasing the uniformity of the frequency of the resulting film bulk acoustic resonators.

Figure 3:
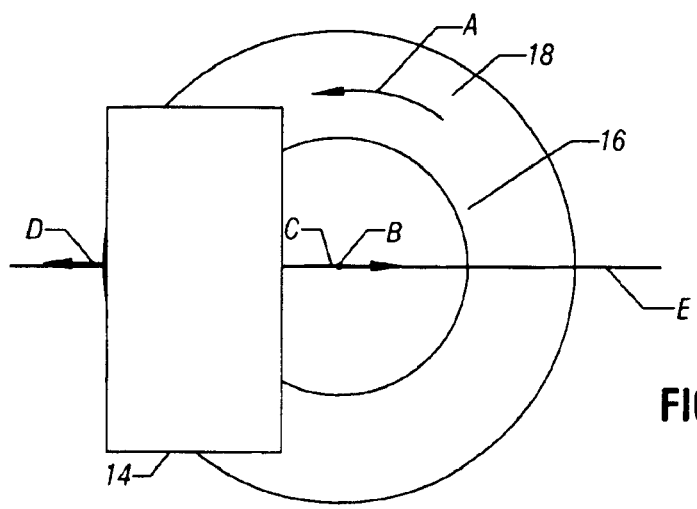
FIG. 3 is a plan view taken generally along the line 3—3 in FIG. 1.

Referring to FIG. 3, in one embodiment of the present invention, the shutter 14 may be rectangular and may be moved along the axis E, which is a radial axis of the wafer 16. Thus, in some embodiments the thickness profile is radially symmetrical. The wafer 16 may be rotated by the chuck 18 in the direction of the arrow A around the axis B.

Because the uniformity of the FBAR filter is improved by controlling the thickness profile of the FBAR at the wafer level, the cost is lower and the throughput is higher compared to current post-process trimming techniques which operate at the chip level. In addition, in some embodiments, in-situ measurement may be unnecessary. Also, post-process trimming techniques may need to be done in a deposition chamber.

A correction may be applied to any of the layers of an FBAR. The correction can be applied on all three layers (top electrode, bottom electrode, and piezoelectric film), on any layer, or may be applied only to the final top electrode layer to obtain an overall uniform frequency. Applying the correction only to the top electrode layer may be advantageous because it may lower costs and simplify processing steps in some embodiments.

Figure 4:
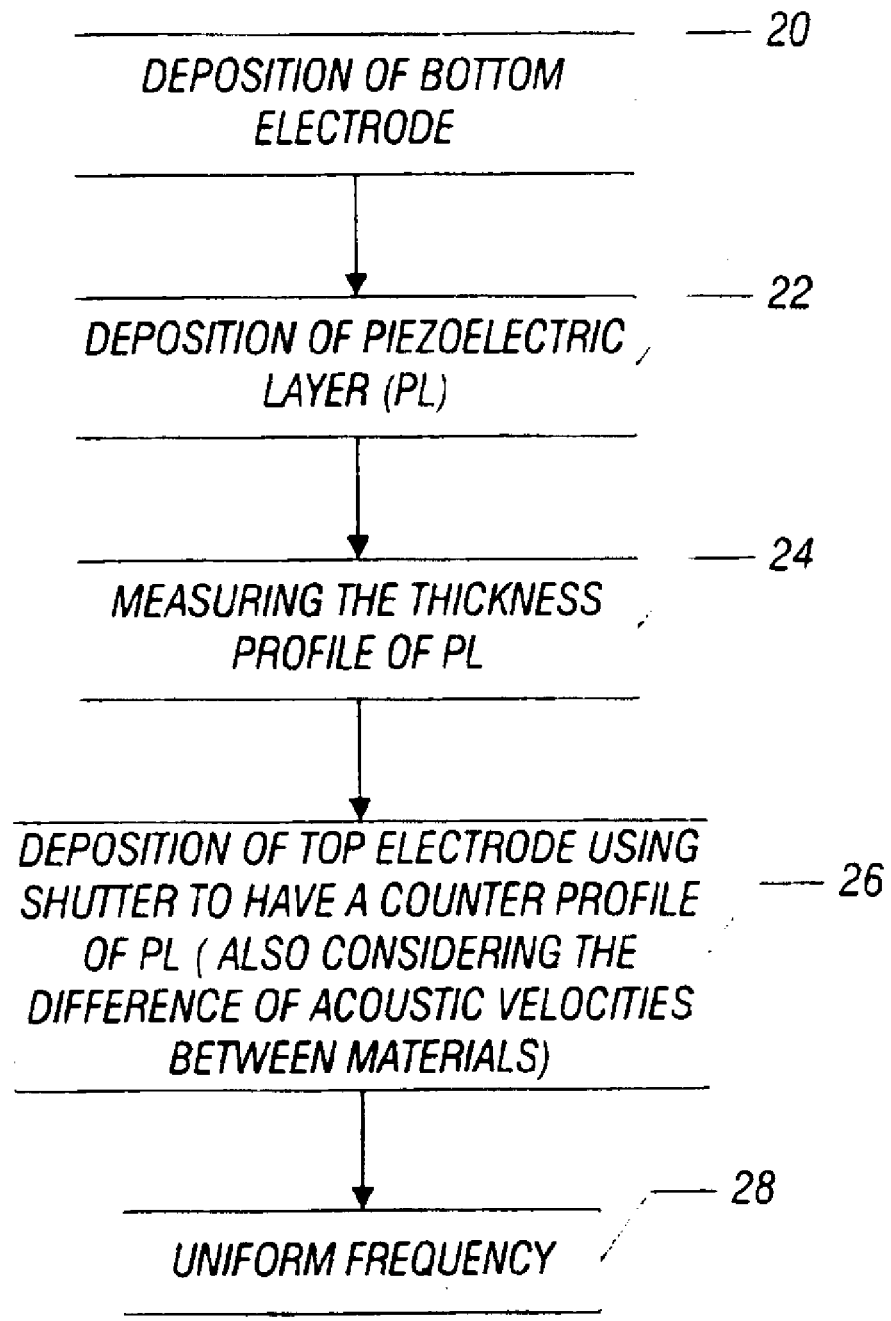
FIG. 4 is a process flow for one embodiment of the present invention.

Referring to FIG. 4, the bottom electrode of the FBAR may be deposited, as indicated in block 20. Then the piezoelectric film may be deposited, as indicated in block 22. The thickness of the piezoelectric film may be measured as indicated at 24. The top electrode may then be deposited using the shutter 14 to generate a counter-profile that corrects any irregularities in the thickness of the piezoelectric film across the wafer 16. The deposition of the top electrode may also consider the difference of acoustic velocities between the various materials.

The desired dwell time (τ) of the shutter 14 at a given position (x,y) is given by the equation:

$$\tau(x, y) = \frac{T(x, y)}{I(x, y)}$$

where I(x,y) and T(x,y) are the beam intensity and the desired film thickness, respectively.

Figure 5:
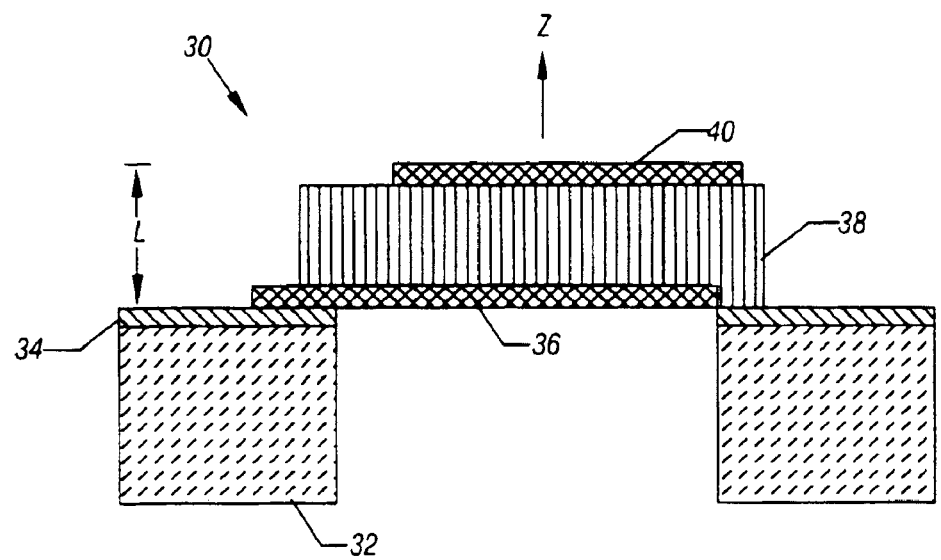
FIG. 5 is an enlarged cross-sectional view of a film bulk acoustic resonator in accordance with one embodiment of the present invention.

Referring to FIG. 5, a FBAR 30 may include a stack of a top electrode 40, a bottom electrode 36, and a piezoelectric film 38. A semiconductor substrate 32 may be positioned under the piezoelectric film 38. An insulator 34, such as silicon dioxide, may be positioned over the substrate 32 in some embodiments. By precisely controlling the thickness of the FBAR 30, the frequency uniformity of the FBARs 30 from a wafer 16 may be improved.

Figure 6:
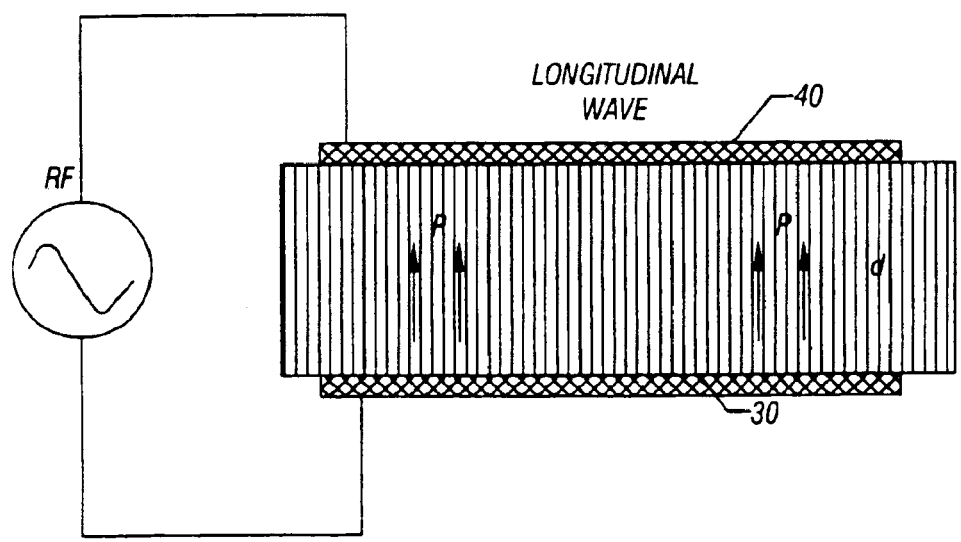
FIG. 6 is a schematic depiction of the operation of a film bulk acoustic resonator in accordance with one embodiment of the present invention.

In some embodiments, the substrate underneath the stack can be removed so that the whole stack can freely resonate in the Z direction when a radio frequency voltage at the resonant frequency (RF) is applied. Thus, referring to FIG. 6, an RF voltage may be applied to the electrodes 40 and 36.

The whole stack may be supported by the thin insulator layer 34 or by the substrate 32, on its perimeter. A longitudinal wave may be induced in the piezoelectric film 38 as indicated.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:

depositing material on a wafer to form a plurality of film bulk acoustic resonators;

rotating the wafer while;

moving a mask across said wafer to make the thickness of material uniform across the wafer; and controlling the dwell time of the mask in one position with respect to the wafer relative to another position with respect to the wafer to control the amount of material that is deposited in one position relative to another position.

2. The method of claim 1 including moving the mask to control the amount of material that is deposited across the wafer when forming a top electrode of a film bulk acoustic resonator.

3. The method of claim 1 including rotating the wafer while spraying the material onto the wafer.

4. The method of claim 3 including linearly moving said mask along a radius of said wafer.

5. The method of claim 1 wherein depositing material includes depositing a bottom electrode, depositing a piezoelectric film, and measuring the thickness of the piezoelectric film.

6. A method comprising:

depositing a bottom electrode for a film bulk acoustic resonator on a wafer;

depositing a piezoelectric film over said bottom electrode;

measuring the thickness of said piezoelectric film; and forming a top electrode over said piezoelectric film by rotating said wafer while moving a mask across said wafer and varying the dwell time of said mask across said wafer to make the thickness of said piezoelectric film uniform across said wafer.

7. The method of claim 6 including moving said mask along a radial axis of said wafer.

8. The method of claim 6 including causing more material to be deposited on a first die on said wafer and less material to be deposited on a second die on said wafer in order to form film bulk acoustic resonators on said first and second die which are of the same thickness.

9. The method of claim 6 including mounting said wafer on a chuck and rotating said chuck while depositing material on said wafer.

* * * * *